United States Patent [19]

Kellogg

[11] Patent Number: 4,739,189

[45] Date of Patent: Apr. 19, 1988

[54] RAPID SLEWING FILTER

[75] Inventor: James R. Kellogg, Cornelius, Oreg.

[73] Assignee: Tektronix, Inc., Beaverton, Oreg.

[21] Appl. No.: 773,165

[22] Filed: Sep. 6, 1985

[51] Int. Cl.[4] .................. H03F 1/02; H03K 17/56; H03B 1/00

[52] U.S. Cl. ...................... 307/240; 307/543; 307/547; 307/549; 307/552; 328/165; 328/167; 330/9; 330/109

[58] Field of Search ............ 330/9, 302, 109, 107, 330/97; 307/240, 543, 546, 547, 549, 552, 555, 556; 328/165, 167

[56] References Cited

U.S. PATENT DOCUMENTS 3,389,346 6/1968 Webb ........................... 330/9
3,668,538 6/1972 Hearn ........................... 330/9

Primary Examiner—Stanley D. Miller
Assistant Examiner—Richard Roseen

Attorney, Agent, or Firm—George T. Noe; John P. Dellett; John Smith-Hill

[57] ABSTRACT

A multiplexer samples multiple analog waveform signals to provide a sequence of input signals to an active low-pass filter. The bandwidth of the filter is determined by an input RC network having series resistance and shunt capacitance elements. As the multiplexer switches state to sample a different analog signal, the resistance elements of the filter are temporarily shorted to allow the filter input signal to rapidly charge or discharge the shunt capacitance element to a steady state voltage in response to any change in input signal voltage. The resistance elements are then unshorted to permit normal low-pass filter operation. Switch means are also provided to selectively disconnect the shunt capacitance element from the network when the resistance elements are shunted, thereby selectively widening the bandwidth of the filter to pass higher frequency input signals.

8 Claims, 2 Drawing Sheets

RAPID SLEWING FILTER

BACKGROUND OF THE INVENTION

The present invention relates in general to filter circuits and in particular to a low-pass filter circuit having a high slew rate.

Analog data acquisition systems often simultaneously acquire waveform data from several different analog signals by sampling the signals in rapid succession, employing digitally controlled multiplexers to successively connect each analog signal to the input of an analog-to-digital (A/D) converter. The A/D converter converts the DC voltage level of each waveform into digital data of proportional magnitude for storage by the acquisition system in a random access memory. When a sampled waveform contains noise, it is desirable to filter out high frequency components in the multiplexer output with a low-pass filter circuit typically having attenuation of 60 db or more at frequencies of 60 Hz or higher, but such filters normally require up to 300 milli-seconds to slew and settle in response to a relatively large voltage difference between two successively sampled signals. The scanning rate at which the multiplexer can be switched from channel to channel is therefore typically limited by the filter slew rate to about three channels per second, a rate which is much too slow to provide adequate sampling of most AC waveforms. What is needed is a low-pass filter with a high slew rate which would permit the multiplexer to sample multiple waveforms at a much higher scanning rate.

SUMMARY OF THE INVENTION

According to one aspect of the invention, the bandwidth and slew rate of an active, low-pass filter are determined by an input RC network having series resistance and shunt capacitance elements, the output voltage of the filter being determined by the charge on the capacitance elements. Means are provided to temporarily short the series resistance elements of the network in response to a change in input voltage, thereby permitting rapid charging or discharging of the shunt capacitance element to a steady state level and allowing the filter output to quickly adjust to the change in filter input. The resistance elements are then unshorted to permit normal filtering action. When used in conjunction with a filter circuit having, for example a 60 dB attenuation at 60 Hz requiring a nominal slew time of 300 milliseconds for output stability, the temporary shunting of the resistance elements can typically decrease the slew time to 500 microseconds or less.

According to another aspect of the invention, a multiplexer is adapted to sample multiple analog waveform signals to provide a sequence of analog sample input voltages for an analog data acquisition system. The output of the multiplexer is filtered by a low-pass filter. As the multiplexer switches state to sample a new analog signal, series filter resistance elements are temporarily shorted, to rapidly slew the output voltage, and then unshorted to permit normal low-pass filter operation. Latch means then apply the filtered output to the data acquisition system input. Control means are provided for switching the multiplexer, shorting and unshorting the resistance elements and operating the latch means in timed sequence according to an applied clock signal. For a typical filter circuit permitting a nominal multiplexer input signal scanning rate of, for instance 3 channels per second, temporarily short circuiting the resistance elements permits a multiplexer scanning rate of several hundred channels per second or more.

According to a further aspect of the invention, switch means are also provided for selectively open circuiting the shunt capacitance elements of the filter circuit when the resistance elements are short circuited, thereby increasing the bandwidth of the filter, allowing it to pass higher frequency input signals while still retaining the high input impedance of the filter. When the filter is used in conjunction with a multiplexer input data acquisition system, this feature permits the system to alternately sample high and low frequency signals with the filter operating in a low-pass mode only when sampling low frequency signals and in an "all-pass" mode when sampling higher frequency signals.

It is accordingly an object of the present invention to provide a new and improved low-pass filter circuit having a high slew rate.

It is another object of the present invention to provide a new and improved filter circuit having selectively either low-pass or all-pass characteristics.

It is still another object of the present invention to provide a new and improved apparatus for rapidly scanning and filtering a plurality of voltage input signals wherein low frequency input signals are selectively low-pass filtered while high frequency signals are high-pass filtered.

DETAILED DESCRIPTION

Figure 1:
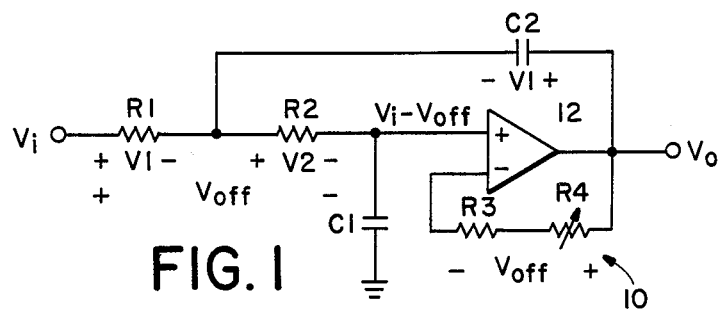
FIG. 1 is a schematic diagram of a low-pass filter circuit of the prior art.

Referring to FIG. 1, a well known Butterworth (Sallen-Key) filter 10 of the prior art, depicted in schematic diagram form, is adapted to provide a low-pass filtered output voltage Vo in response to an input voltage Vi. The filter 10 comprises a high gain operational amplifier 12, having a non-inverting input for receiving the filter input signal Vi through an RC network including a pair of series resistors R1 and R2 and a shunt capacitor C1, coupling the non-inverting amplifier input to ground. The output of the filter 10 comprises the output voltage Vo of amplifier 12 which is fed back to its inverting input through resistors R3 and R4, the resistance of resistor R4 being adjustable.

When C1 is charged to a steady state voltage, a small input current passing through R1 and R2 causes a small offset voltage drop ($V_{off} = V_1 + V_2$) across R1 and R2 such that the voltage across C1 at the non-inverting input of amplifier 12 is Vi-Voff. The resistance of feedback resistor R4 is adjusted such that a steady state current, passing into the inverting input of amplifier 12 through resistors R3 and R4, causes a similar offset voltage drop across R3 and R4. If the input impedance of the amplifier 12 is large compared to R3+R4, and if the nominal gain of amplifier 12 is large, a steady state voltage at the inverting input of amplifier 12 will substantially equal a steady state voltage at the non-inverting input, and the steady state DC output voltage Vo of the filter will substantially equal the input voltage Vi.

The amplifier 12 output is also coupled to the junction between resistors R1 and R2 through a capacitor C2. The transfer function of the filter circuit 10 can be determined by dividing the output impedance (Xo) of the circuit by its input impedance (Xin) as follows:

$$Xo/Xin = [(R1R2C2)C1)]^{-1}$$

$$\times [S^2 + ((R1+R2)/(R1R2C2))S + (1/(R1R2C2)C1)]^{-1}$$

This is equivalent to the transfer function of an RLC filter of the form:

$$Vo/Vin = [1/LC]/[S^2 + (Ro/L)S + (1/LC)]$$

where $Ro = R1 + R2$, $L = (R1R2C2)$, and $C = C1 = C2$. Attenuation is 40 db/decade or 12 db/octave, and the bandwidth of the circuit, the frequency at which $-3$ db attenuation (i.e. $Vo = 0.707Vin$) occurs is:

$$\omega_p = (1/LC)^{\frac{1}{2}}[1-(RoRoC/4L)]^{\frac{1}{2}} \text{ rad/s.} \quad [1]$$

or by substitution of the definitions of Ro, L and C into equation [1], $$\omega_p = [1/R1R2C1C2]^{\frac{1}{2}}[(R1+R2)^2C1/4(R1R2C2)]^{\frac{1}{2}} \text{ rad/s.} \quad [2]$$

When the filter input voltage Vi changes from one DC level to another, currents flow through resistors R1 and R2 to charge or discharge C1 and through resistor R1 to charge or discharge capacitor C2. Since these capacitors take time to charge or discharge, the resulting change in Vo lags the change in Vi. When the input voltage Vi is maintained at a steady state DC level for a sufficient time to permit the output voltage to reach a corresponding steady state level, the voltage across capacitor C1 will be maintained at Vi-Voff, while the voltage across capacitor C2 will settle to V1.

When the input voltage Vi changes abruptly from a first DC voltage level to a second DC voltage level, the output voltage Vo rises or falls to a level matching the second DC level at a slew rate determined by a time constant R1C1. In a typical application, wherein the values of R1 and C1 are chosen for a 60 dB attenuation at 60 Hz, the output voltage requires on the order of 300 milliseconds to slew and settle to a magnitude which is stable to within 1 part in 4096.

Figure 2:
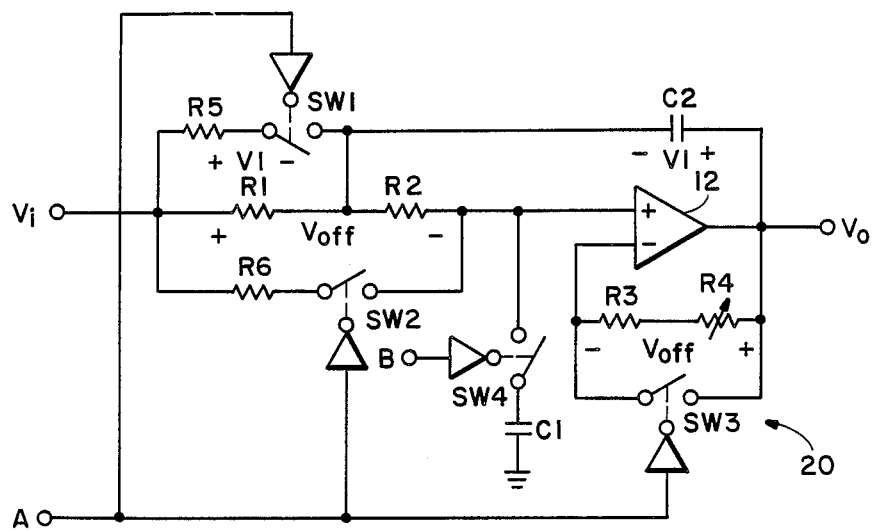
FIG. 2 is a schematic diagram of a rapid slewing, low-pass filter according to the present invention.

Referring to FIG. 2, there is depicted in schematic diagram form a low-pass filter 20 adapted according to the present invention to provide a substantially increased slew rate in response to a change in input voltage Vi. The filter 20 comprises an operational amplifier 12, resistors R1R4, and capacitors C1 and C2 interconnected in a manner similar to the corresponding elements of the prior art Butterworth filter 10 of FIG. 1. However, in addition to these elements, the filter 20 of the present invention also comprises first switch means SW1 to selectively shunt resistor R1 with a small resistance R5, along with second switch means SW2 to selectively shunt both resistors R1 and R2 through another small resistor R6. Filter 20 further includes switch means S3 to selectively connect the amplifier 12 output Vo directly to its inverting input to shunt resistors R3 and R4, and switch means S4 to selectively disconnect capacitor C1 from the inverting input of amplifier 12. Switch means SW1-4 are preferably high speed electronic switches having switching states controlled according to applied digital signals, switches SW1-3 closing when a terminal A is driven low and switch SW4 closing when a terminal B is driven low.

When terminal A is high and terminal B is low, switches SW1-3 are open and switch SW4 is closed. In this state the filter 20 operates as a low-pass filter in a fashion similar to that of the Butterworth filter 10 of FIG. 1 and has a relatively low slew rate. When terminal A is then driven low, switches SW1-3 also close, and capacitors C1 and C2 will quickly charge or discharge in response to any step change in input voltage level, assuming resistors R5 and R6 are negligibly small compared to resistors R1 and R2, since comparatively large charging or discharging currents, no longer limited by R1 and R2, are applied to the capacitors C1 and C2. When the capacitors C1 and C2 have charged or discharged to a steady state voltage level, the input voltage Vi, less a negligible drop across resistor R6, will appear at the non-inverting input of amplifier 12.

The slew rate of the filter circuit 20 is increased by many orders of magnitude when switches S1-3 are closed, but at the same time the bandwidth of the filter circuit 10 is also increased by many orders of magnitude (to approximately 1/R6C1), and circuit 20 will not block high frequency signals. However if S1-S3 are reopened after the output voltage Vo reaches its steady state value in response to a change in input voltage, the circuit 20 will again operate as a low-pass filter. Thus if the switches S1-S3 are briefly closed immediately after a change in input voltage magnitude, and then reopened, the filter circuit will rapidly adjust its output to the input voltage change and then continue to operate as a low-pass filter.

If switches SW1-3 remain closed long enough for the output voltage Vo to reach a steady state DC level in response to a change DC input voltage Vi, the amplifier 12 output voltage Vo will exhibit little transient response when the switches SW1-3 are reopened because there will be only a small change in voltage across capacitors C1 and C2. With the switches S1-S3 closed, the steady state output voltage Vo and the voltage across C1 will equal Vi and the voltage across C2 will be substantially 0. With switches S1-S3 opened, the steady state output voltage will also be Vi and the voltage across capacitor C1 will be maintained at Vi-Voff, while the voltage across capacitor C2 will settle to V1, matching voltage across R1. If Voff and V1 are relatively small, then very little fluctuation in voltages across capacitors C1 and C will occur after switches SW1-3 are opened and therefore very little fluctuation in output voltage Vo will occur.

In the preferred embodiment of the present invention, switches SW1-4 comprise high speed, low leakage, optically isolated MOSFET switches, although in other embodiments the switches may comprise other switch means such as relays. Resistors R5 and R6 are provided to damp any ringing due to any small inherent capacitances associated with switches SW1 and SW2.

Thus the circuit 20 of the present invention can be operated in a rapid slewing mode in response to a change in input voltage by temporarily applying a low control voltage to terminal A, thereby closing switches SW1-3, and may be operated in a low-pass filter mode by applying a high control signal voltage to terminal A, thereby reopening switches SW1-3 when the output voltage reaches steady state. In addition, switch SW4, which selectively disconnects capacitor C1 from the inverting input of amplifier 12, may be opened by applying a high control voltage to terminal B. If switches SW1-3 are closed while switch SW4 is opened, circuit 20 will operate in an "all pass" mode wherein the circuit has a very wide bandwidth. In this all-pass mode, the input voltage Vi is applied directly to the non-inverting input of amplifier 12 while the amplifier output voltage Vo is applied directly to the inverting input to maintain the gain of the circuit 20 at unity. Thus, switch SW4 allows the bandwidth of the circuit to be selectively increased.

Figure 3:
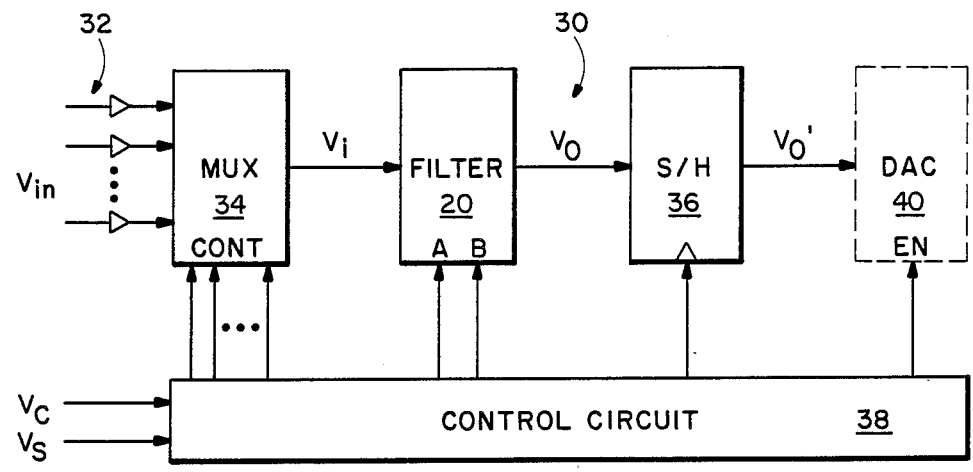
FIG. 3 is a block diagram of an apparatus according to the present invention for rapidly scanning and filtering a plurality of input voltage signals.

Referring to FIG. 3, there is depicted in block diagram form a circuit 30 according to the present invention adapted to sequentially sample and filter a plurality of input voltage signals Vin; circuit 30 includes a set of buffering amplifiers 32, each providing a buffered output signal according to a separate input signal Vi, each buffered output signal being applied as a separate input of a multiplexer 34. The output of multiplexer 34, being a selected one of the buffered inputs, is applied as an input Vi to a filter circuit 20, similar to the filter circuit 20 of FIG. 2. The output Vo of filter circuit 20 is applied to an input of a sample and hold circuit 36. In a typical application, the latch output Vo' may be applied as an input to a data acquisition system 40, including means for converting the latch output signal Vo' to a digital signal of representative magnitude and means for storing the digital signal output of the converting means.

A control circuit 38 provides signals for operating the switching control input of multiplexer 34, the A and B control inputs of filter circuit 20, the sampling control input of sample and hold circuit 36, and an input enabling control of DAC 40 in timed response to a clock signal Vc and an all-pass mode control signal Vs. In operation, control circuit 38 advances the switching state of multiplexer 34 on the trailing edge of each input clock signal Vc pulse so that the multiplexer scans each input signal in turn, sequentially transmitting each input signal or "channel" to the filter circuit 20 input. The Vc input signal is also applied to the A input of filter circuit 20. When the all-pass signal Vs is low, the control circuit 38 maintains the B input terminal of filter circuit 20 in a low state and applies the Vc input signal to the A input terminal of the filter circuit. As described hereinabove, when the A terminal is driven low and the filter circuit 20 enters the rapid slew mode wherein the output Vo of the filter circuit rapidly adjusts to a change in input voltage level, and when the A terminal is driven high the filter enters the low-pass filter mode. Therefore, on receipt of a negative-going edge of the Vc signal the filter circuit 20 rapidly slews, while on receipt of a positive going edge of the Vc signal the filter circuit low-pass filters the input signals. The length of each negative-going Vc signal pulse is adjusted to allow the filter circuit 20 to fully slew in response to any anticipated step change in input voltage magnitude caused by multiplexer 34 channel switching.

The sample and hold circuit 36 samples the output voltage Vo of the filter circuit 20 and holds it as its output Vo' on receipt of a negative-going pulse edge at its clock input. Such sample and hold circuits are commonly known in the art and are not further detailed herein. Control circuit 38 delays the Vc signal pulse by a time sufficient to permit the filter circuit to slew in response to a change in input and then utilizes the delayed Vc signal to clock the sample and hold circuit 36.

The control circuit 38 further delays the Vc signal by an amount sufficient to ensure that the sample and hold circuit 36 has sampled the Vo signal and applies the further delayed Vc signal to an enable EN input terminal of the DAC 40, the negative-going edge of each delayed clock signal pulse enabling the DAC to sample, convert and store its current input signal Vo'.

Thus when the B input to the filter circuit 20 is held low, the sample and hold circuit 36 output Vo' transmitted to the DAC circuit 40 comprises a sequence of DC voltage levels, each level representative of a sampled magnitude of one low-pass filtered multiplexer 34 input signal. The sampling rate of the multiplexer can be comparatively high since it is not limited by the slew rate of filter 20 in the low-pass mode but rather by the slew rate of the filter in the rapid slew mode, which is several orders of magnitude faster than the low-pass mode slew rate.

When the A input terminal of the filter circuit 20 is driven low while the B input terminal is driven high, the filter circuit enters the the all-pass mode. When the control signal Vs is high, control circuit 38 maintains the A terminal low and the B terminal high regardless of the state of the clock input signal, thereby maintaining the filter circuit 20 in the all pass mode. The all-pass mode may be utilized when the input signals Vi are high frequency and the low-pass filtering operation of the filter 20 is not desired, but wherein the high input impedance of the filter circuit 20 is to be maintained. If the all-pass control signal Vs is driven high whenever the input signal Vi is of a frequency higher than the cut-off frequency of the filter, and is driven low whenever the input signal is higher than the filter cut-off frequency, then the filtering action of the filter 20 can be activated or deactivated as the multiplexer 34 scans from signal to signal as necessary to block high frequency noise in low frequency input signals or to pass high frequency input signals. Thus circuit 30 can be used to simultaneously scan and selectively low-pass filter a mixed set of high and low frequency input signals by appropriately controlling the all-pass signal Vs.

Figure 4:
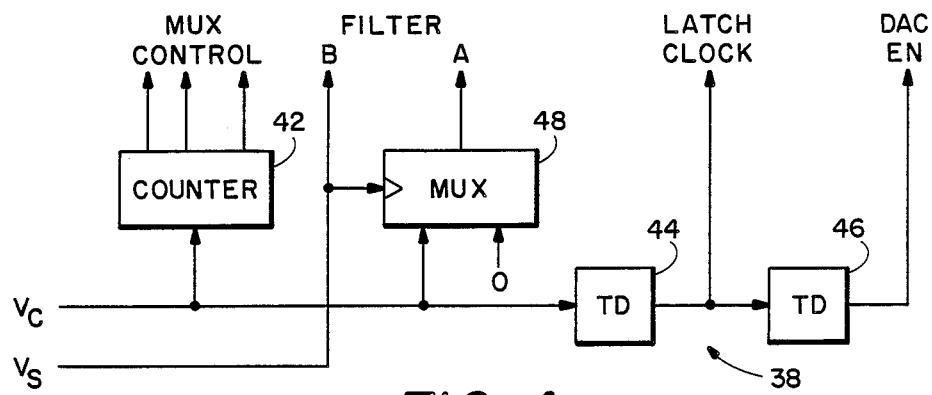
FIG. 4 is a block diagram of the control circuit of FIG. 3.

Referring to FIG. 4 an embodiment of the control circuit 38 of FIG. 3, depicted in block diagram form, comprises a counter 42 for generating a digitally encoded count of the trailing edges of Vc clock signal pulses, the count being applied as the switching control signal input to the multiplexer circuit 34. The control circuit also includes first signal time delay means 44 for producing the delayed Vc signal to the sample control input of sample and hold circuit 36 and second signal delay means 46 for producing the further delayed Vc signal to the enabling input of the DAC system 40. A multiplexer circuit 48 selectively applies either the Vc signal or a logical 0 (low) signal to the A input of filter circuit 20 depending on whether the applied all-pass signal Vs connected to the control input of multiplexer 48 is low or low or high. The all-pass control signal Vs is also directly connected to the B input of filter circuit 20.

Thus filter circuit 20 has three modes of operation. In a "rapid slewing" mode of operation it responds rapidly to a change in magnitude of input signal Vi to produce an output signal Vo of comparable magnitude. In a "low pass" mode of operation it acts like a low pass filter with a relatively low cutoff frequency but responds less quickly to changes in Vi. In an "all pass" mode, the filter has a relatively high bandwidth. The mode of operation of the circuit is determined by the state of the binary control signal applied to terminal A for controlling switches SW1–SW3 and by the binary control signal applied to terminal B which controls switch SW4. The circuit operates in the all pass mode when terminal A is driven low and terminal B is driven high. When terminals A and B are low, the circuit operates in the rapid slewing mode, and when B is low and A is high, the circuit operates in the low pass filter mode. The Vs signal at terminal B of the filter controls switch SW4 which connects a capacitor C1 to the input of amplifier 12. When Vs is driven high, SW4 opens, thereby disconnecting C1 from the amplifier input. When Vs is driven high it also switches multiplexer 48 of FIG. 4 so that the multiplexer passes a logical "0" to terminal A, thereby causing switches SW1–SW3 to close. Switch SW3 connects the output of amplifier 42 to its input so that it has unity gain. Switches SW1 and SW2 remove the high resistances R1 and R2 from the input signal path. With R1, R2 and C1 removed from the input signal path, the filter operates in the all pass mode and does not filter the input signal. This mode is suitable when the input signal is high frequency and no filtering is desired, but when the high input impedance of the amplifier is desired.

When the Vs signal is driven low, the filter circuit 20 operates in either the rapid slewing mode or in the low pass filter mode depending on the state of clock signal Vc. As clock signal Vc goes low, counter 42 changes the switching state of multiplexer 34 so that a new input signal is applied to filter 20. At the same time, clock signal Vc closes switches SW1–SW3 so as to put filter 20 in its high slew rate mode. The filter stays in that mode as long as Vc is low and then, when Vc goes high, opens SW1–SW3 so that the filter begins to operate in its low bandpass mode. Some time thereafter, as determined by delay circuit 44, sample and hold circuit 36 samples the filtered output signal of filter 20. The period of time during which the filter is in its high slew rate mode is determined by the width of the negative portion of each pulse of a typical square wave clock signal Vc. In order to provide for proper operation of the filter circuit, the length of the negative pulse of clock signal Vc should be sufficient to ensure that, for the maximum expected abrupt change in filter input signal magnitude, the high slew rate mode continues until the filter input and output voltages equalize.

While a preferred embodiment of the present invention has been shown and described, it will be apparent to those skilled in the art that many changes and modifications may be made without departing from the invention in its broader aspects. For instance, many low-pass filters employing various series resistor and shunt capacitor networks to set the passband characteristics of the filter are known in the art and the slew rate of many of these filters may be increased by selectively shorting the series resistance elements in a manner according to the present invention to permit the shunt capacitance elements to rapidly charge or discharge in response to a change in filter input voltage. The appended claims are therefore intended to cover all such changes and modifications as fall within the true spirit and scope of the invention.

I claim:

1. A circuit for filtering an input signal to produce an output signal, the circuit having a slew rate determined according to the level of a control signal provided to said circuit, comprising:

an amplifier having a non-inverting input terminal, an inverting input terminal, and an output terminal, said amplifier producing said output signal at said output terminal;

a first resistive path for conveying said input signal to said non-inverting input terminal;

a second resistive path connecting said output terminal to said inverting input terminal;

a first capacitor coupling said output terminal to said first resistive path;

first means for selectively shunting said first resistive path with a third resistive path of lower resistance according to the level of said control signal; and second means for selectively shunting said second resistive path with a fourth resistive path of lower resistance according to the level of said control signal.

2. A circuit for filtering an input signal to produce an output signal, the circuit having a slew rate and a bandwidth determined according to levels of first and second control signals provided to said circuit, comprising:

an amplifier having an non-inverting input terminal, an inverting input terminal, and an output terminal, said amplifier producing said output signal at said output terminal;

a first circuit node;

a node of common reference potential;

a first resistor, said input signal being supplied to said first circuit node through said first resistor;

a second resistor connected between said first circuit node and said non-inverting input terminal;

a third resistor connected between said output terminal and said inverting input terminal;

means for selectively shunting said first resistor with a first path of lower resistance according to the level of said first control signal;

means for selectively connecting said input signal to said non-inverting input terminal through a second path of resistance lower than the combined resistance of said first and second resistors according to the level of said first control signal;

means for selectively shunting said third resistor with a third path of lower resistance according to the level of said first control signal;

a first capacitor connected between said output terminal and said first circuit node;

a second capacitor; and means for selectively connecting said second capacitor between said amplifier non-inverting input terminal and said node of common reference potential according to the level of said second control signal.

3. A circuit for producing a voltage signal comprising filtered portions of a plurality of analog signals, the circuit comprising:

means for producing a control signal alternating between first and second levels;

a first circuit node;

means for successively applying said analog signals to said first circuit node in response to successive changes in said control signal from said first level to said second level;

an amplifier having an input terminal and an output terminal, said output signal being produced at said output terminal; and means for capacitively and resistively coupling said output signal to said input signal, for connecting said first circuit node to said input terminal through a first resistance when said control signal is of said first level and for connecting said first circuit node to said input terminal through a second resistance when said control signal is of said second level, said first resistance being higher in magnitude than said second resistance.

4. A circuit for producing an output signal comprising filtered portions of a plurality of analog signals, the circuit comprising:
- an amplifier having a non-inverting input terminal, an inverting input terminal, and an output terminal, said amplifier producing said output signal at said output terminal;
- means for producing a control signal alternating between first and second levels;
- a node of common reference potential;
- a first circuit node;
- means for successively applying said analog signals to said first circuit node in response to successive changes in said control signal from said first level to said second level;
- a first resistive path connected between said first circuit node and said non-inverting input terminal;
- a second resistive path lower in resistance than said first resistive path;
- a third resistor coupling the amplifier output terminal to its inverting input terminal;
- a capacitor connected between said non-inverting input terminal and said node of common reference potential; and
- means for connecting said second resistive path between said first circuit node and said non-inverting input terminal when said control signal is of said second level and for disconnecting said first resistive path from between said first circuit node and said noninverting input terminal when said control signal is of said first level.

5. A circuit as in claim 4 further comprising:
- means for selectively shunting said third resistor with a third path of lower resistance when said control signal is of said second state.

6. A circuit responsive to a first control signal alternating between first and second levels for producing an output signal comprising filtered portions of a plurality of input signals, the circuit comprising:
- an amplifier having a non-inverting input terminal, an inverting input terminal, and an output terminal, said amplifier producing said output signal at said output terminal;
- a node of common reference potential;
- a first circuit node;
- a second circuit node;
- means for successively applying said input signals to said first circuit node in response to successive changes in said first control signal from said first level to said second level;
- a first resistor connecting said first and second circuit nodes;
- a second resistor connecting said second circuit node to said non-inverting input terminal;
- a third resistor connecting said output terminal to said input terminal;
- a first resistive path having lower resistance than said first resistor;
- a second resistive path having lower resistance than a sum of resistances of said first and second resistors;
- a third resistive path having lower resistance than said third resistor;
- a first capacitor connected between said noninverting input terminal and said node of common reference potential;
- a second capacitor connected between said output terminal and said second circuit node;
- means for connecting said first resistive path between said first circuit node and said second circuit node when said first control signal is of said second level and for disconnecting said first resistive path from between said first circuit node and said second circuit node when said first control signal is of said first level;
- means for connecting said second resistive path between said first circuit node and said non-inverting input terminal when said first control signal is of said second level and for disconnecting said second resistive path from between said first circuit node and said non-inverting input terminal when said first control signal is of said first level; and
- means for connecting said third resistive path between said inverting input terminal and said output terminal when said first control signal is of said second level and for disconnecting said third resistive path from between said inverting input terminal and said output terminal when said first control signal is of said first level.

7. The circuit in accordance with claim 6 further comprising:
- means for producing a second control signal; and
- means for disconnecting said second capacitor from between said non-inverting input terminal and said node of common reference potential according to said second control signal.

8. The circuit in accordance with claim 1 wherein said first and second resistive paths have resistances such that said input signal and said output signal have substantially equal magnitudes when said first resistive path is not shunted by said first means and said second resistive path is not shunted by said second means.

* * * * *